US008658544B2

(12) United States Patent
Olefjord et al.

(10) Patent No.: US 8,658,544 B2
(45) Date of Patent: Feb. 25, 2014

(54) METHOD FOR TEXTURING SILICON SURFACES AND WAFERS THEREOF

(75) Inventors: Ingemar Olefjord, Pixbo (SE); Timothy C. Lommasson, Heggedal (NO)

(73) Assignee: Norut Narvik AS, Narvik (NO)

( * ) Notice: Subject to any disclaimer, the term of this patent is extended or adjusted under 35 U.S.C. 154(b) by 206 days.

(21) Appl. No.: 12/922,349

(22) PCT Filed: Mar. 12, 2009

(86) PCT No.: PCT/NO2009/000092
§ 371 (c)(1),
(2), (4) Date: Nov. 24, 2010

(87) PCT Pub. No.: WO2009/113874
PCT Pub. Date: Sep. 17, 2009

(65) Prior Publication Data
US 2011/0059618 A1    Mar. 10, 2011

(30) Foreign Application Priority Data

Mar. 14, 2008  (NO) .................................. 20081386

(51) Int. Cl.
*H01L 21/302*  (2006.01)
*H01L 21/461*  (2006.01)
*C25F 3/00*  (2006.01)
*B23H 3/00*  (2006.01)
*B23H 5/00*  (2006.01)

(52) U.S. Cl.
USPC ............. 438/745; 216/99; 205/640; 205/646; 438/753

(58) Field of Classification Search
USPC .............. 216/99; 438/745, 753; 205/640, 646
See application file for complete search history.

(56) References Cited

U.S. PATENT DOCUMENTS

| 3,078,219 | A |   | 2/1963 | Chang |
| 5,129,982 | A | * | 7/1992 | Wang et al. ................... 438/694 |
| 5,445,718 | A | * | 8/1995 | Wang ............................ 205/646 |
| 5,863,412 | A |   | 1/1999 | Ichinose et al. |
| 5,949,118 | A |   | 9/1999 | Sakai et al. |
| 6,284,670 | B1 |  | 9/2001 | Abe et al. |
| 2005/0148198 | A1 | * | 7/2005 | Ein-Eli et al. ................ 438/746 |
| 2006/0254928 | A1 | * | 11/2006 | Ein-Eli et al. ................ 205/655 |

FOREIGN PATENT DOCUMENTS

EP    0504956 A2    9/1992
JP    11-220146 A    8/1999

OTHER PUBLICATIONS

Faust et al., "Study of the Orientation Dependent Etching and Initial Anodization of Si in Aqueous KOH," Journal of the Electrochemical Society, Electrochemical Society, Manchester, New Hampshire, vol. 130, No. 6, Jun. 1, 1983, pp. 1413-1420, XP009133283.
International Search Report dated May 26, 2010 for International Application No. PCT/NO2009/000092.

(Continued)

*Primary Examiner* — Allan Olsen
*Assistant Examiner* — Margaret D Klunk
(74) *Attorney, Agent, or Firm* — Birch, Stewart, Kolasch & Birch, LLP

(57) ABSTRACT

This invention relates to a method for texturing a silicon surface and silicon wafers made by the method, where the method comprises immersing the wafers in an alkaline solution at pH>10, and applying a potential difference between the wafer and a platinum electrode in the electrolyte in the range of +10 to +85 V.

11 Claims, 19 Drawing Sheets a)

b)

Pre-etched for 5 minutes in 2 weight% KOH at 70 °C, then polarised for 5 minutes at pulsing from 50 to 30 V. Picture a) is at 1700X magnification and b) at 3200X magnification (showing neighbour area of a)).

(56) References Cited

OTHER PUBLICATIONS

Izidinov et al., "Electrochemical and Photoelectrochemical Behaviour of the Silicon Electrode in Acid and Alkaline Solutions," Russian Journal of Physical Chemistry, Chemical Society, London, GB, vol. 36, No. 6, Jun. 1, 1962, pp. 659-664, XP-009133224.

Norwegian Search Report dated Sep. 30, 2008 for Norwegian Application No. 2008 1386.

Notification of Transmittal of the International Preliminary Report on Patentability dated Sep. 27, 2010, Form PCT/IPEA/416 and International Preliminary Report on Patentability Form PCT/IPEA/409 for International Application No. PCT/NO2009/000092.

Van Muylder et al., "Atlas of Electrochemical Equilibria in Aqueous Solutions," Ed. M. Pourbaix, pp. 458-463, NACE (National Association of Corrosion Engineers), Houston, 1974.

Zhang et al., "Porous Silicon Formation and Electropolishing of Silicon by Anodic Polarization in HF Solution," Journal of the Electrochemical Society, vol. 136, No. 5, May 1, 1989, pp. 1561-1565, XP-002574121.

English translation only of the Japanese Office Action for Japanese Application No. 2010-550624 dated Aug. 7, 2012.

* cited by examiner

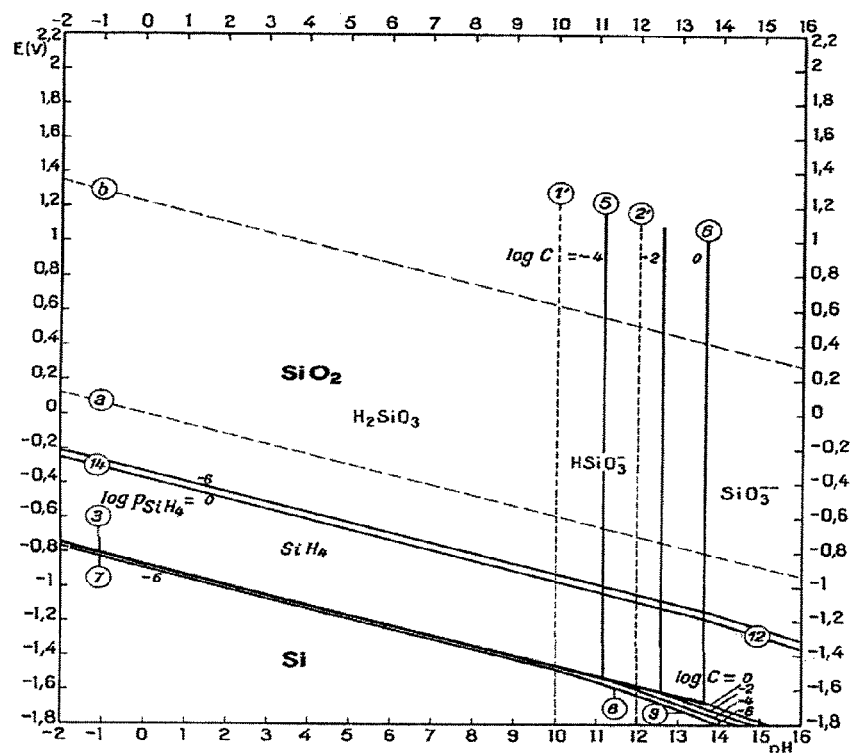
Figure 1: Pourbaix diagram of Si [1]

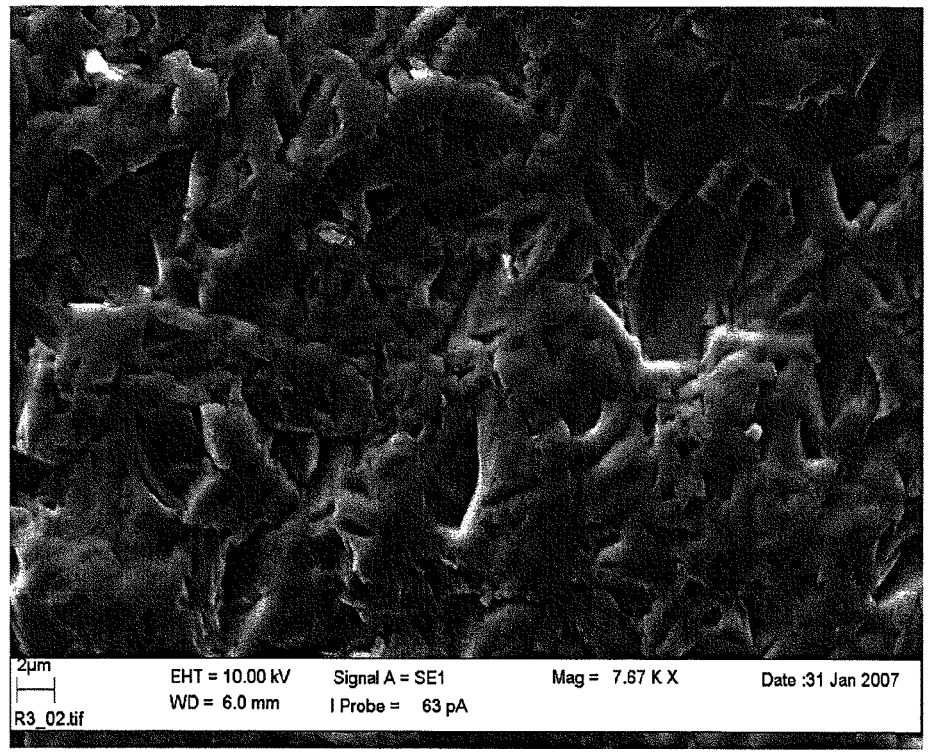
Figure 2  SEM micrograph of as cut silicon wafer at magnification 3000X

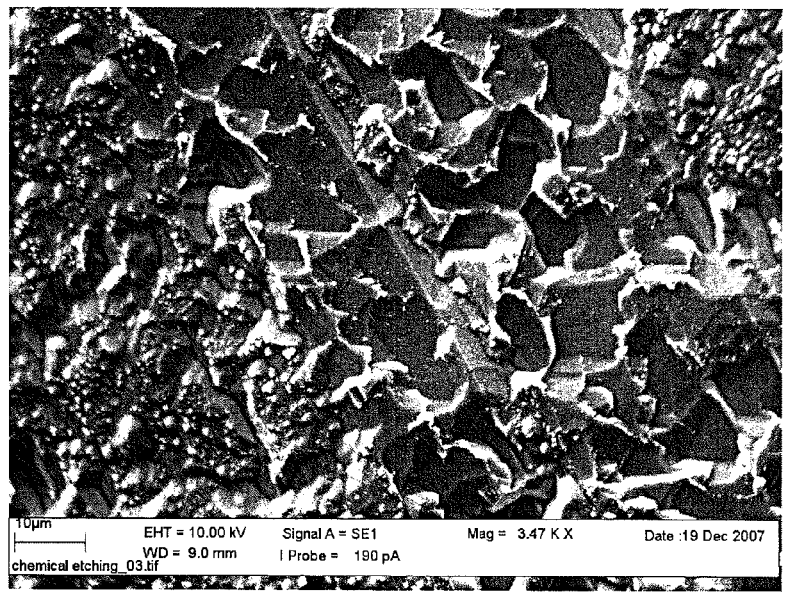
a)
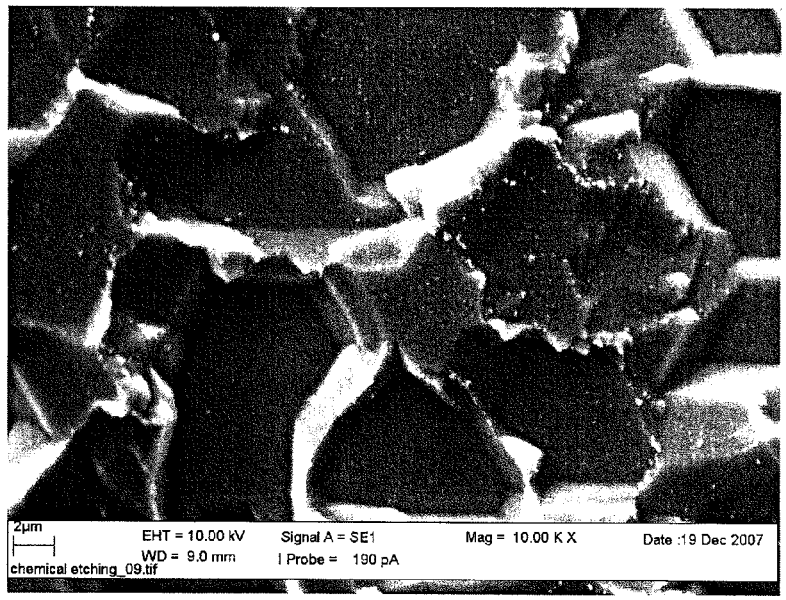
b)
Figure 3  Chemically etched wafer; 20 weight% KOH, 50 °C and 10 minutes exposure time. Picture a) is at 1150X magnification and b) at 3200X magnification.

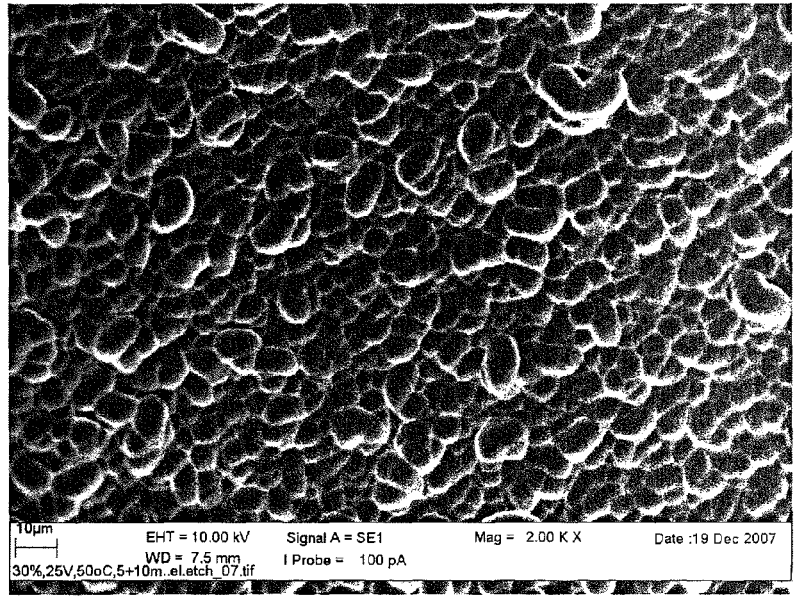
a)
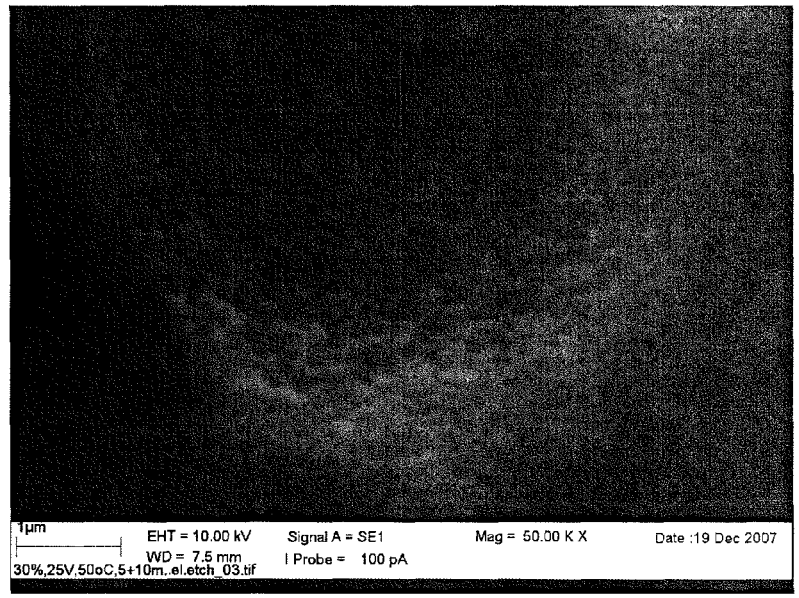
b)
Figure 4   Pre-etched for 5 minutes in 30 weight% KOH at 50 °C, then polarised for 10 minutes at 25 V. Picture a) is at 650X magnification and b) at 17000X magnification.

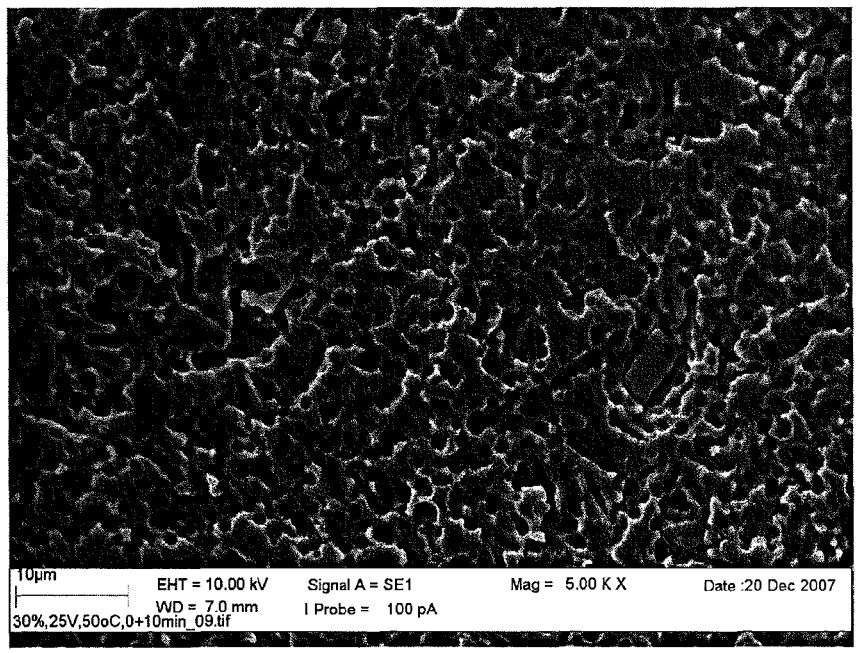
a)
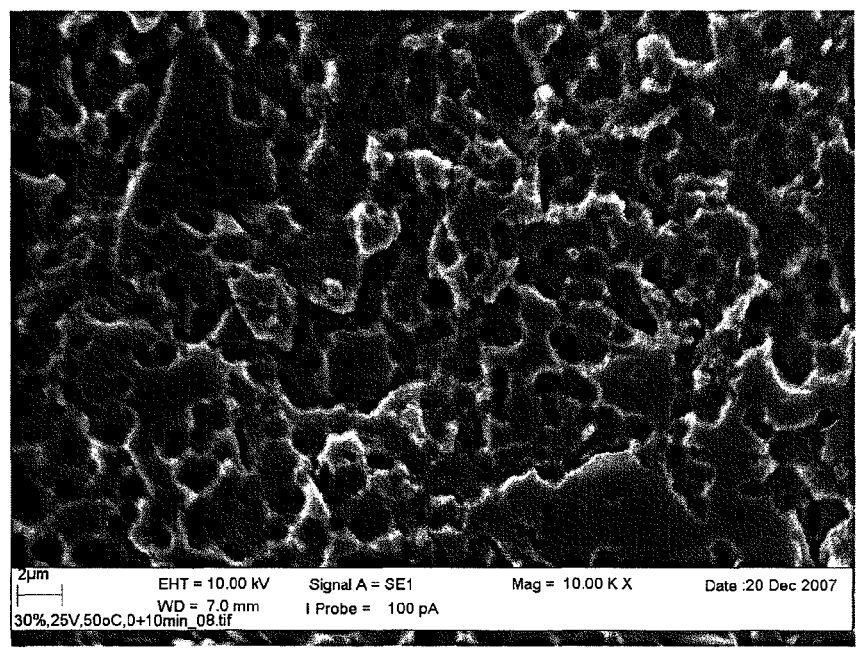
b)
Figure 5     Polarised in 30 weight% KOH at 50 °C for 10 minutes at 25 V. (no pre-etching). Picture a) is at 1700X magnification and b) at 3200X magnification.

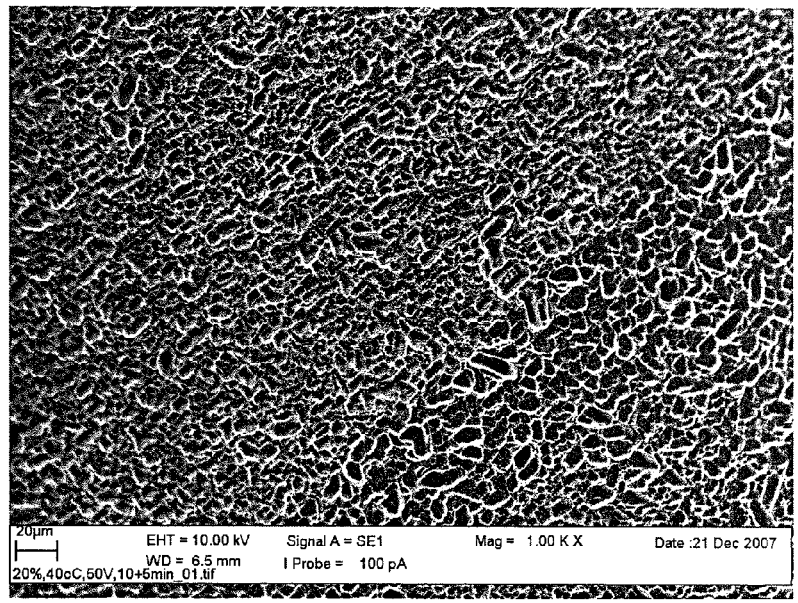
a)
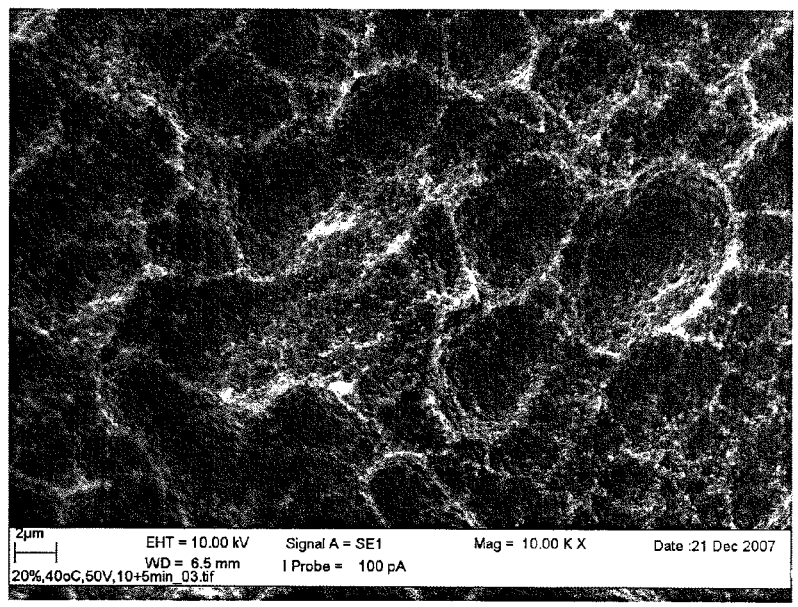
b)
Figure 6  Pre-etched for 10 minutes in 20 weight% KOH at 40 °C, then polarised for 5 minutes at 50 V. Picture a) is at 320X magnification and b) at 3200X magnification.

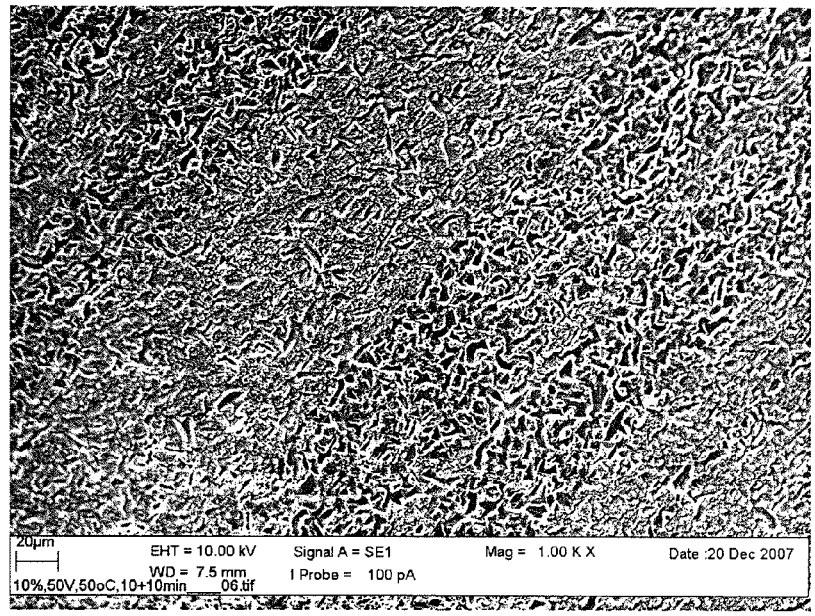
a)
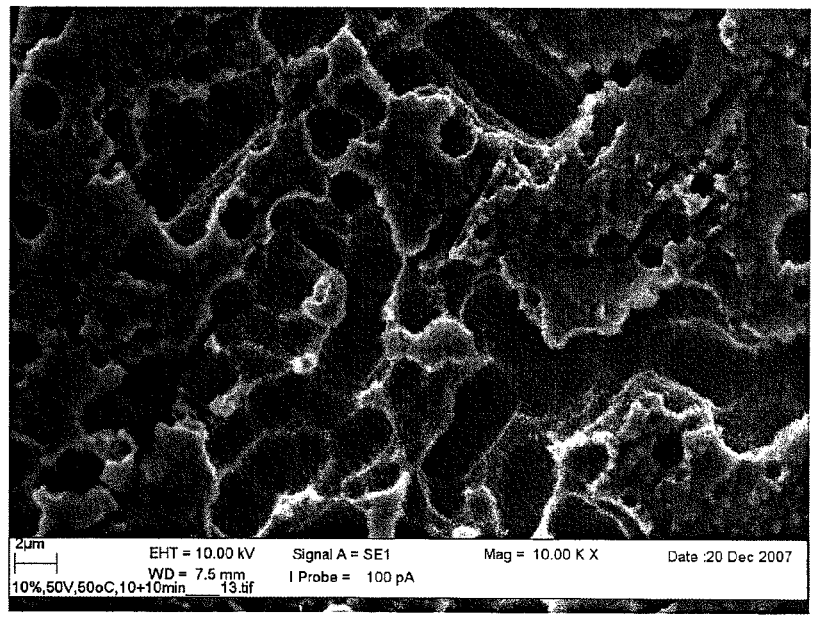
b)
Figure 7    Pre-etched for 10 minutes in 10 weight% KOH at 50 °C, then polarised for 10 minutes at 50 V. Picture a) is at 320X magnification and b) at 3200X magnification.

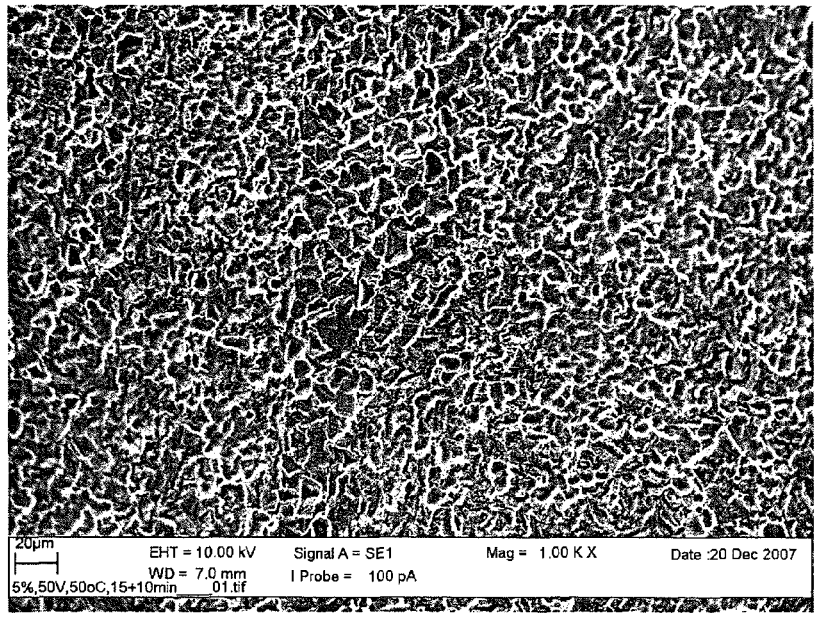
a)
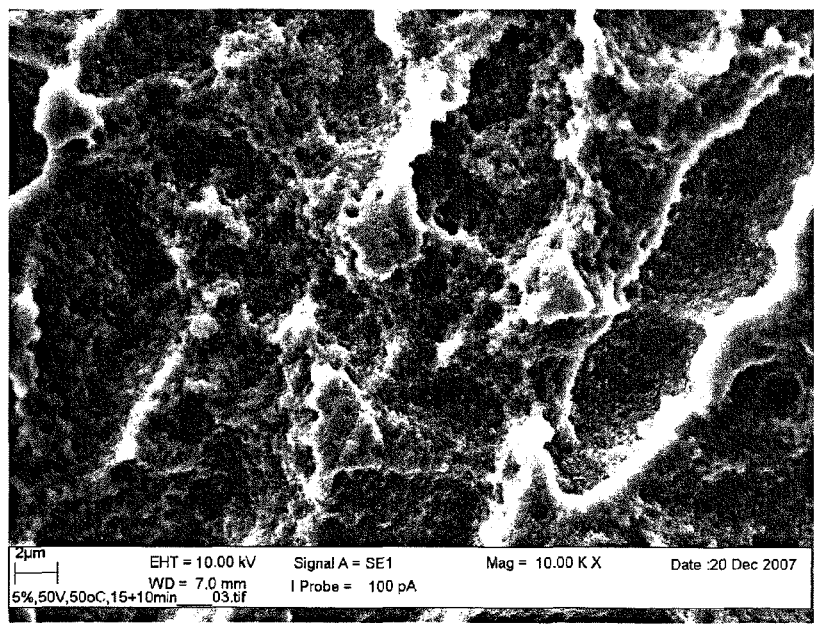
b)
Figure 8   Pre-etched for 15 minutes in 5 weight% KOH at 50 °C, then polarised for 10 minutes at 50 V. Picture a) is at 320X magnification and b) at 3200X magnification.

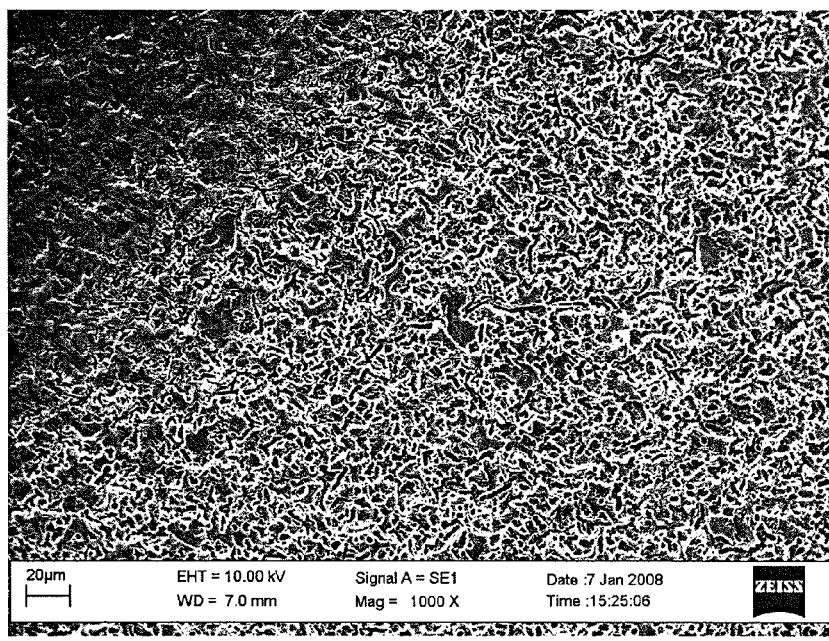
a)
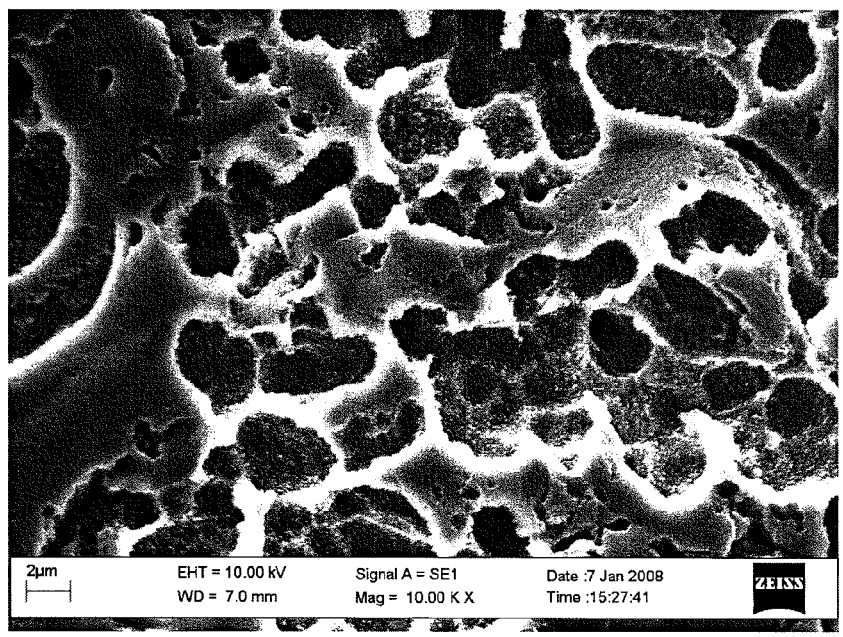
b)
Figure 9    Polarised for 5 minutes in 5 weight% KOH at 70 °C with pulsing potential from 50 to 25 V. (No pre-etching). Picture a) is at 320X magnification and b) at 3200X magnification.

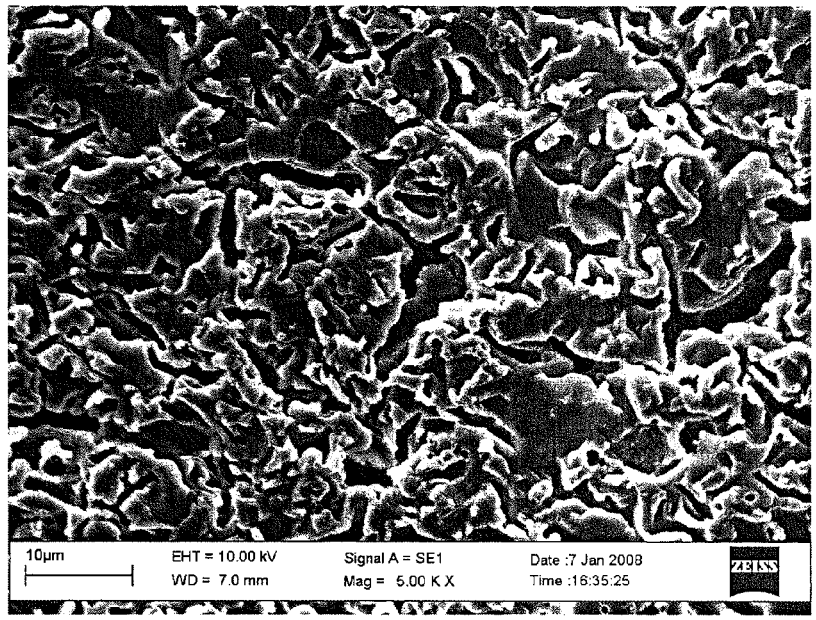
a)
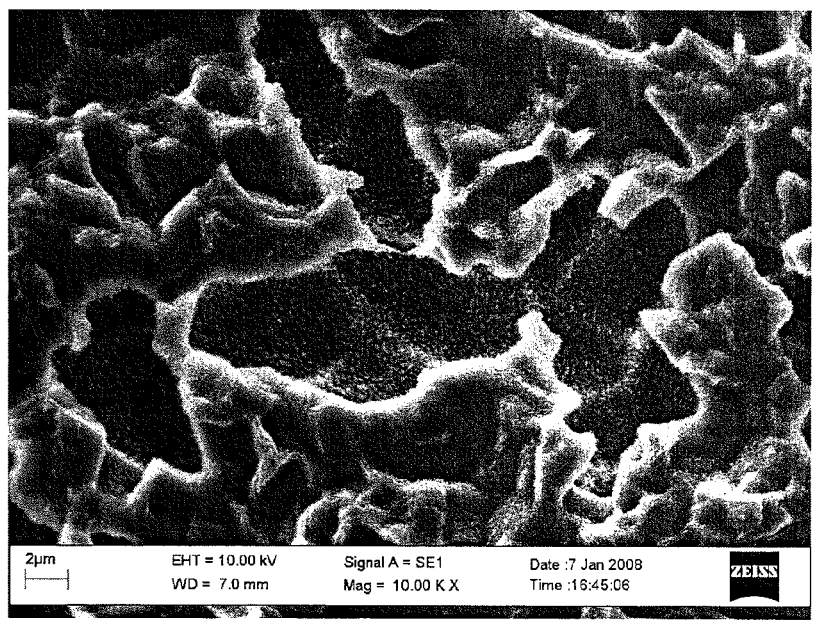
b)
Figure 10   Pre-etched for 5 minutes in 2 weight% KOH at 70 °C, then polarised for 5 minutes at pulsing from 50 to 30 V. Picture a) is at 1700X magnification and b) at 3200X magnification (showing neighbour area of a)).

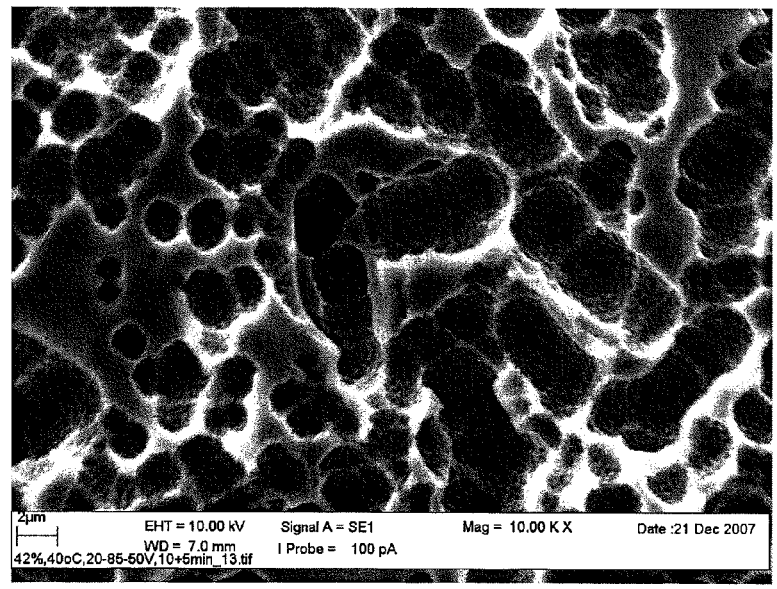
Figure 11:Pre-etched for 10 minutes in 42 weight% KOH at 40 °C, then polarised for 0.5 minutes at 85 V and then at 50 V for 5 min, 3200X.

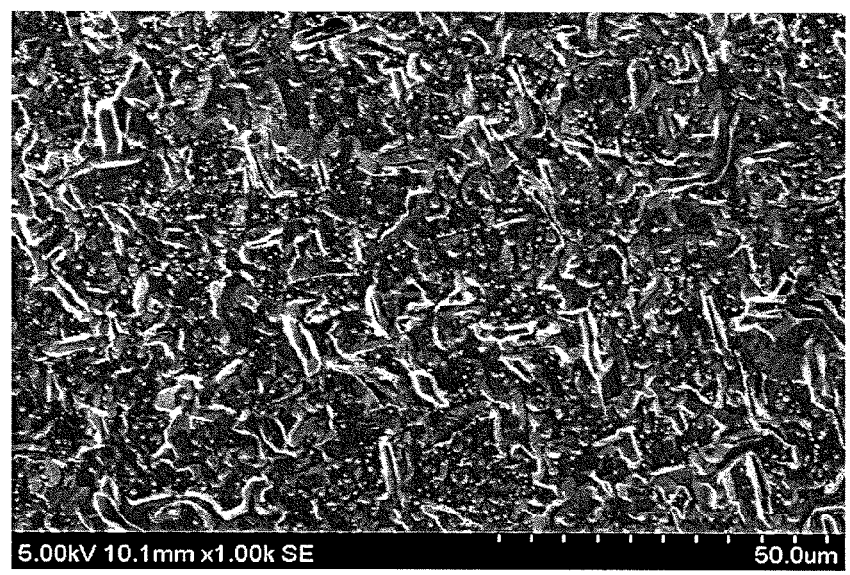
Figure 12: Polarized at 6 V for 5 min in 20 weight% KOH at 50 °C, pre-etched for 5 min, 1000X.

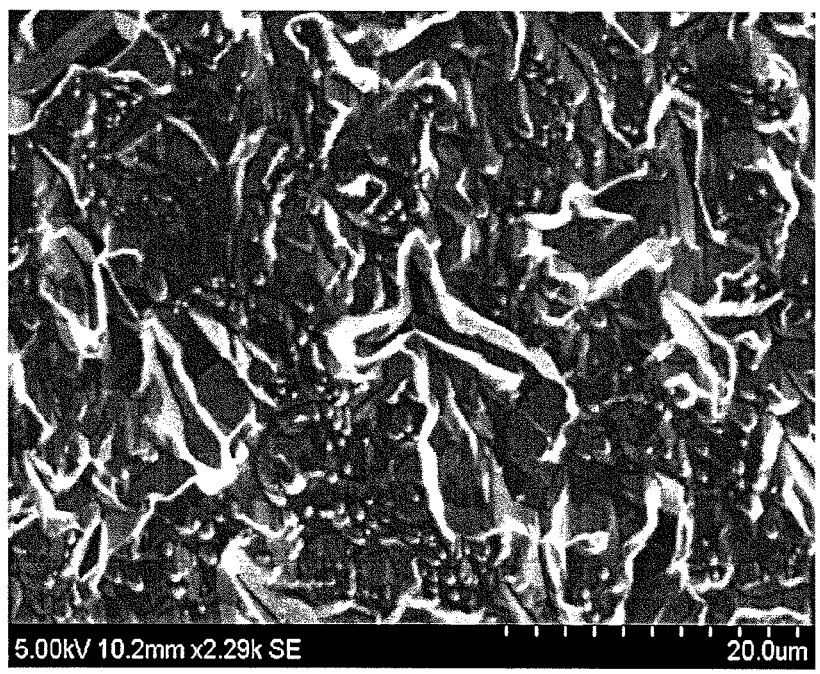
Figure 13: Polarized at 6 V for 5 min in 20 weight% KOH at 85 °C, pre-etched for 2 min, 1000X.

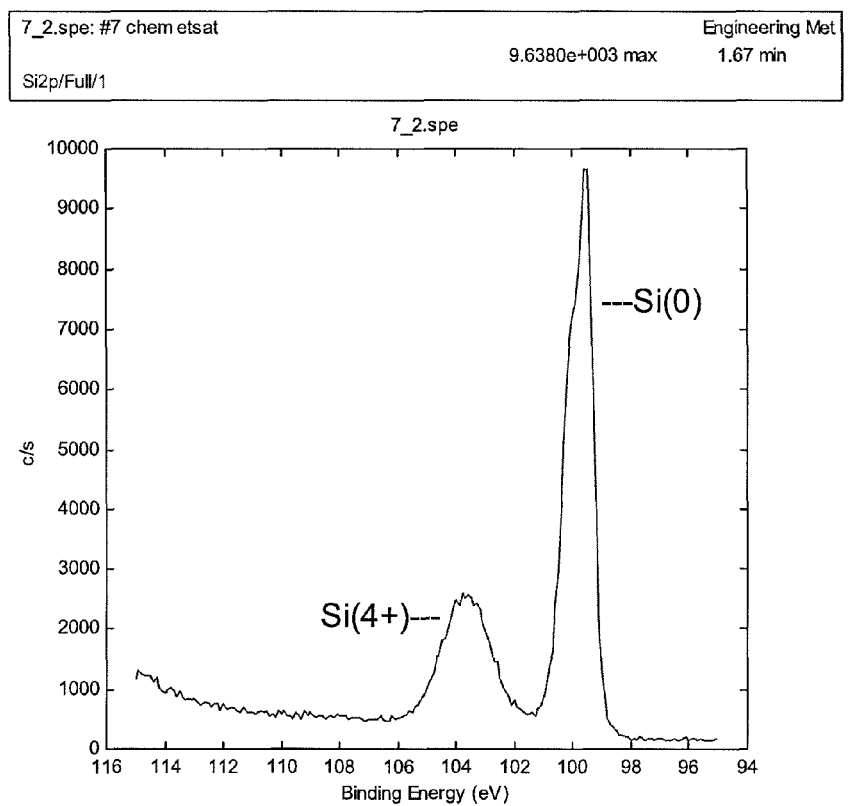
Figure 14: XPS-spectrum recorded from a chemically etched wafer exposed to 20 weight% KOH at 50 °C for 10 min. This is the same sample as in Fig.3.

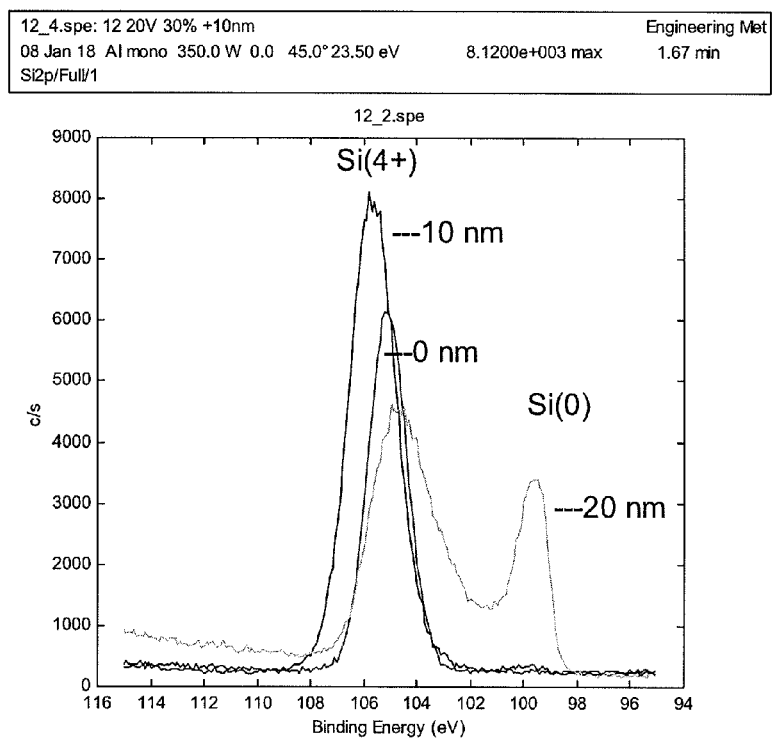
Figure 15: XPS- spectra recorded from a pre-etched and polarized sample; 30 weight% KOH, 25 V, 10 min. The notations (0 nm, 10nm and 20 nm) represent the ion-etch depths.

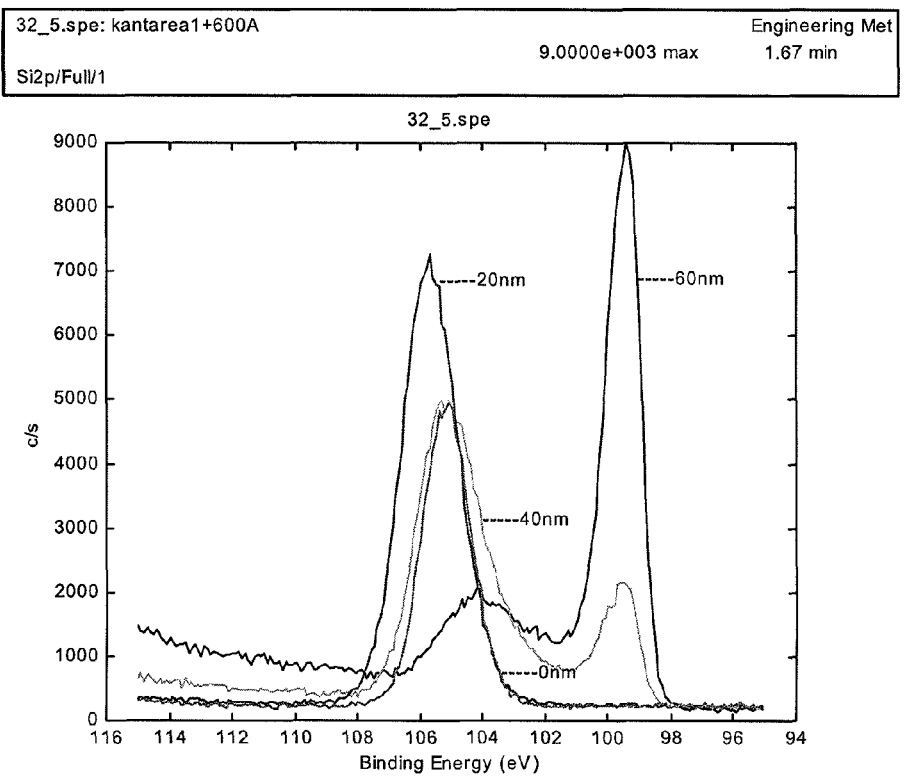
Figure 16: XPS- spectra recorded from a sample pre-etched 10 min, 20 weight% KOH, 40 °C. Polarized: 5 min 20 V; 5 min 50 V, ½ min 70 V; 5 min 50 V; ½ min 70 V; 3 min 50 V; 4 min 20 V, 200X. The ion-etch depths are 0 nm, 20 nm, 40 nm and 60 nm. This is the same sample as in Fig.17 a-d.

a)
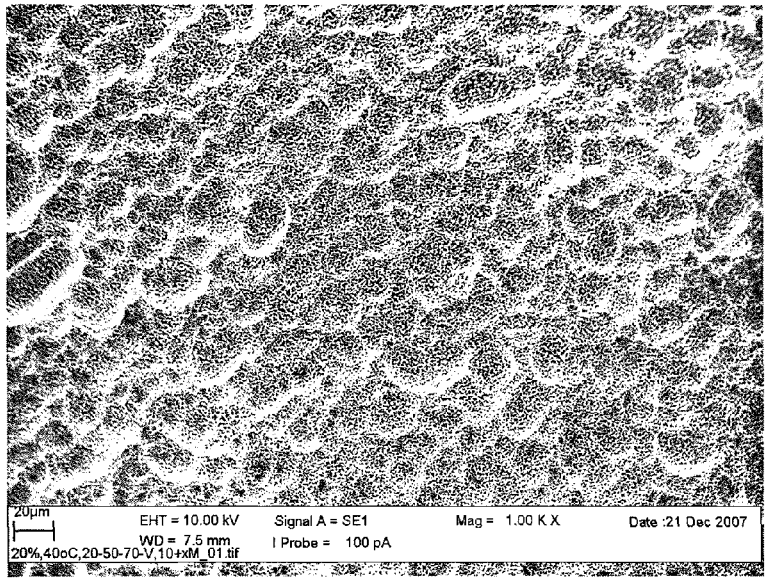
b)
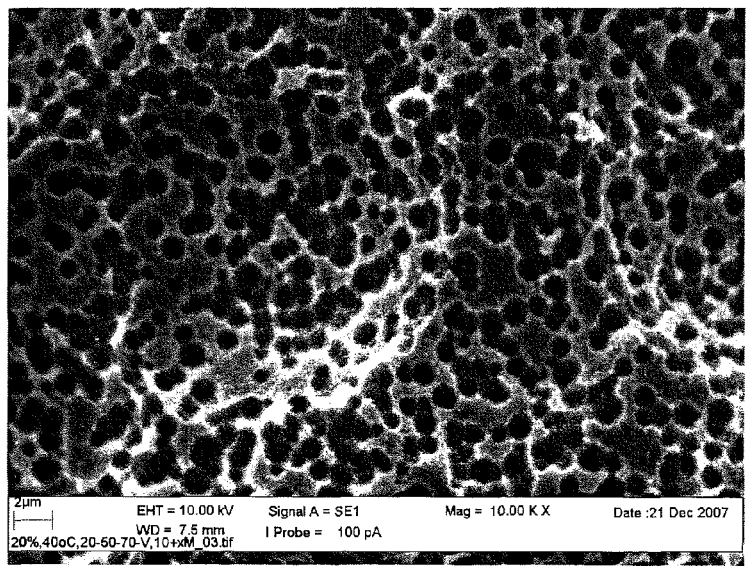
Figure 17  Pre-etched for 10 minutes in 20 weight% KOH at 40 °C, then polarised for 5 minutes at 20 V, 5 minutes at 50 V, 0.5 minute at 70 V, 5 minutes at 50 V, 0.5 minutes at 70 V, 3 minutes at 50 V, and 4 minutes at 20 V. Picture a) is at 320X magnification and b) at 3200X magnification.

c)
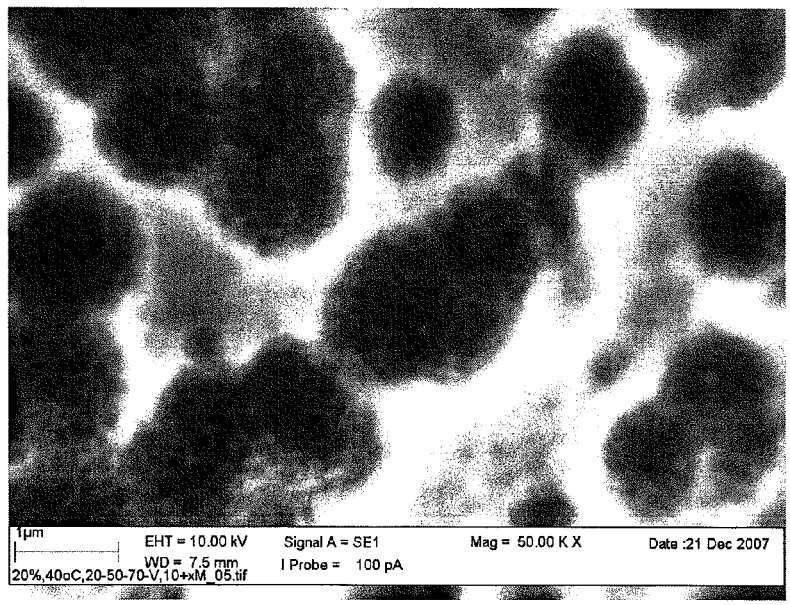
d)
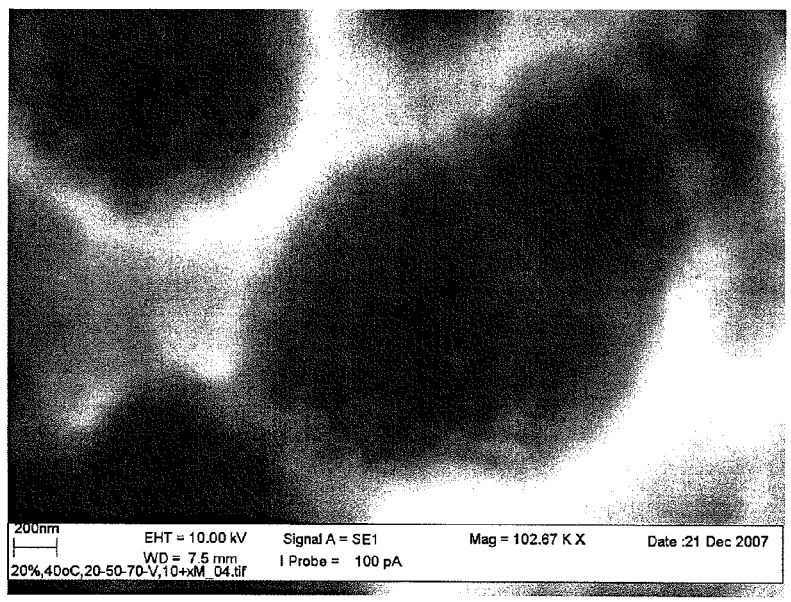
Figure 17 Pre-etched for 10 minutes in 20 weight% KOH at 40 °C, then polarised for 5 minutes at 20 V, 5 minutes at 50 V, 0.5 minute at 70 V, 5 minutes at 50 v, 0.5 minutes at 70V, 3 minutes at 50 V, and 4 minutes at 20 V. Picture c) is at 17000X magnification and d) at 35000X magnification

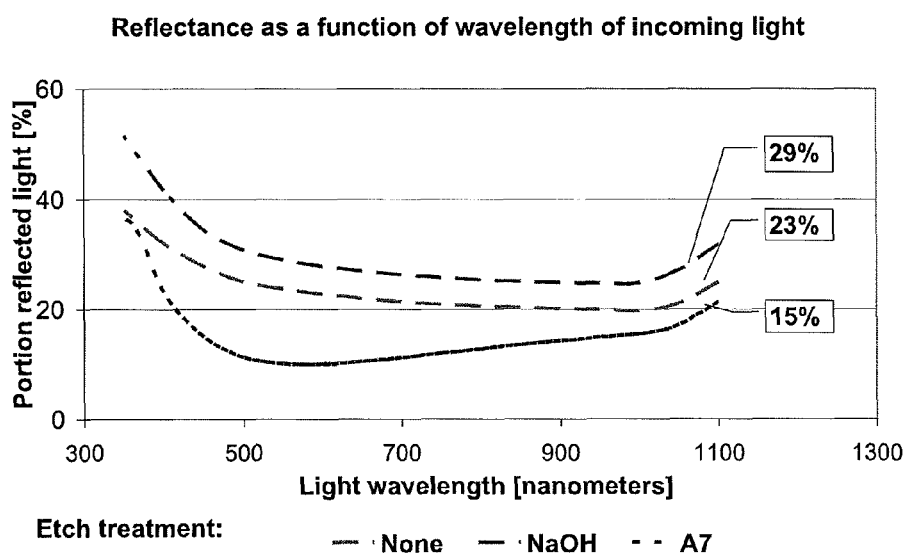
Figure 18: Comparison of measured reflectance of incoming light from silicon wafers. Upper curve shows wafer chemically etched in NaOH, middle curve shows untreated (as-cut) wafer, and lower curve shows wafer etched according to the invention.

METHOD FOR TEXTURING SILICON SURFACES AND WAFERS THEREOF

This invention relates to a method for texturing a silicon surface and silicon wafers made by the method.

BACKGROUND

The world supplies of fossil oil are expected to be gradually exhausted in the following decades. This means that our main energy source for the last century will have to be replaced within a few decades, both to cover the present energy consumption and the coming increase in the global energy demand.

In addition, there are raised many concerns that the use of fossil energy is increasing the earth greenhouse effect to an extent that may turn dangerous. Thus the present consumption of fossil fuels should preferably be replaced by energy sources/carriers that are renewable and sustainable for our climate and environment.

One such energy source is solar light, which irradiates the earth with vastly more energy than the present and any foreseeable increase in human energy consumption. However, solar cell electricity has up to date been too expensive to be competitive with nuclear power, thermal power etc. This needs to change if the vast potential of the solar cell electricity is to be realised.

Most of the solar cells are produced from mono- or multi-crystalline silicon. Due to its high surface reflexivity, the surface of silicon based photovoltaic materials is usually surface treated to enhance the absorption of incoming radiation and thus increase the current generated in the cells. A rough surface improves the absorption while a flat surface reflects the incoming beam to a higher degree. In order to maximize the efficiency of the cells they are textured (roughened) and/or covered with an anti-reflection coating by depositing one or more dielectric layers.

PRIOR ART

Texturing of silicon wafers is presently done by chemical etching in either strong alkaline solutions or in a mixture of hydrofluoric acid and nitric acid. Unfortunately, both techniques have their clear disadvantages.

Etching in alkaline solutions give a non-uniform dissolution of Si and thereby an inhomogeneous texturing. The reason for the behaviour is that dissolution of multi-crystalline Si is due to the orientation of the surface grains. Thereby, the reflectance of the light becomes relatively high. This problem is solved by use of etching in hydrofluoric/nitric acid which gives an isotropic etching, which is orientation independent. However, the handling of the acids and the treatment of the wastes are costly and environmentally hazardous. Also, this process is difficult to control, the wafers are more prone to damage, and the process is more expensive.

U.S. Pat. No. 6,284,670 discloses an etching process for silicon devices forming recessions on the silicon surface by an anisotropic etching in KOH-solution of a silicon wafer through a mask, followed by an isotropic etching in the same etching solution of the anisotropic etched recessions. The isotropic etching is obtained by applying a voltage of 0.3 to 6 V. At voltages from 0.2 V to zero, the etching becomes anisotropic and may be regarded as a chemical etching process enhanced by the imposed potential. The anisotropic etching is reported to give recessions with sharp edges/corners, while the isotropic etching is reported to smooth the surface area of the recessions giving rounded off edge portions of the recessions formed by the anisotropic chemical etching.

The electrochemical behaviour of silicon in water is a function of potential, pH and temperatures. The reactions and products formed at 25° C. are described in the Pourbaix diagram [1] such as shown in FIG. 1. The diagram gives the potential and pH relations for electrochemical reactions in their equilibrium conditions.

The anodic reaction between Si and water can be described by the formula:

$$Si + 2H_2O = SiO_2 + 4H^+ + 4e^- \qquad (1)$$

The equilibrium potential for this reaction is:

$$E(0) = -0.857 - 0.0591 pH. \qquad (2)$$

The potential, Eqn. 2, shows a pH dependency and it is represented by line 3 in the diagram, FIG. 1. $SiO_2$ is stable above that line. Below the line Si is stable from a thermodynamically point of view.

Line 5 in the diagram represents the reaction:

$$SiO_2 + H_2O = HSiO_3^- + H^+ \qquad (3)$$

The $HSiO_3^-$ concentration varies with the pH:

$$\log(HSiO_3^-) = -15.21 + pH \qquad (4)$$

At a concentration of $HSiO_3^-$ equal to $10^{-4}$ M, the pH becomes 11.21. The lines denoted a and b in the diagram represent the hydrogen and the oxygen evolution reactions, respectively. The potential –pH range between these lines represents the stability range of water.

At low pH-values the equilibrium of the reaction Eqn. 3 is shifted towards left giving $SiO_2$.

The oxide formed at pH<10 is stable in aqueous solutions except for HF-solutions. However, at higher pH values $SiO_2$ reacts with water and forms different silicates, $H_2SiO_3$, $HSiO_3^-$ and $SiO_3^{2-}$. The solubility of the silicates is dependent of the cation present in the solution. In alkaline solutions containing alkali metals like Na, K etc. the silicates are water soluble.

OBJECTIVE OF THE INVENTION

The objective of this innovation is to provide a method for texturing of silicon wafers which allows use of alkaline etching solutions and which provides silicon wafers with a significantly lower reflexivity compared to wafers subject to present chemical etching processes.

The objectives of the invention may be obtained by the features as set forth in the description of the invention below and/or in the patent claims.

DESCRIPTION OF THE INVENTION

The invention is based on the realisation that by imposing a potential above the stability potential of water during etching of silicon wafers in alkaline solutions, there will locally be formed oxygen and protons at the wafer surface lowering the pH at the wafer surface. And further, that by imposing a sufficiently strong potential, there will be formed local spots/regions on the wafer surface where the current density is sufficiently strong, and thus the proton formation, to locally lower the pH to allow formation of stable $SiO_2$ even in strong alkaline solutions. Further, the adjacent areas of these chemically passivated (by formation of $SiO_2$) areas are not protected by the current induced proton formation, and will thus be subject to etching by the alkaline solution. Thus, the use of a high potential in strong alkaline etching solutions will shift the anisotropic chemical etching of silicon in alkaline solutions to a more isotropic etching with a more homogeneous character than conventional chemical etching in alkaline solutions. Thus, the anodic polarisation according to the invention causes homogeneous etching of the wafer.

Thus in a first aspect the present invention relates to a method for texturing silicon wafers where the method comprises:
immersing the wafers in an alkaline solution at pH>10, and
applying a potential difference between the wafer and a platinum electrode in the electrolyte in the range of +10 to +85 V.

The term "anisotropic etching" as used herein, means an etching process which involves different etch rates at different directions in the crystals of the silicon material, and thus provides a surface area with an enhanced surface roughness. Thus, the term "isotropic etching" as used herein, means an etching process which takes place at the same rate in the different crystal directions of the silicone material and which provides a uniform textured surface. The term "textured surface" as used herein, means any surface that have been subject to treatment for enhancing the surface roughness.

The term "alkaline solution" as used herein means any solution of an alkali metal hydroxide in water. Examples of suitable alkali compounds for making the alkaline solution includes, but is not limited to; LiOH, RbOH, NaOH and KOH.

The term "potential difference" as used herein, means a difference in the electric potential between two points, i.e. the work which must be done against electrical forces to move a unit charge from one point to the other, also known as electromotive force (EMF). The quantities of the potential differences are given in V between the working electrode and a counter electrode of platinum.

The method according to the invention provides a homogeneous surface texturing on silicon wafers that significantly reduces the reflectance of incoming radiation, and thus significantly enhances the efficiency of the cells. This effect is believed to be obtained by the following mechanism:

The imposed potential above the stability region of water are believed to create decomposition of water to protons and oxygen gas by the following reaction:

$$2H_2O = O_2 + 4H^+ + 4e^- \qquad (5)$$

While the silicon is anodically dissolved in alkaline solutions:

$$Si = Si^{4+} + 4e^- \qquad (6)$$

Both reactions take place on the surface. If the pH on the surface is above 10 the $Si^{4+}$ ions, Eqn. 5, reacts immediately with water and form silicate-ions. On the other hand, if the current density is high the oxygen reaction, Eqn. 5, produces protons, which lower the pH locally on the surface. Thereby, $SiO_2$ is formed on the surface; the overall reaction is described by Eqn. 1 given above.

The dissolution of Si and formation of $SiO_2$ on the surface is initially supposed to take place on crystal planes with a preferential orientation, which is (100). Further, these reactions take initially place on local areas where the oxygen reaction is most intense. Thereby, these areas are passivated by formation of $SiO_2$ and allow dissolution (etching) of nearby areas. The oxygen reaction rate slows down on the passivated areas; thereby, pH increases and the oxide is dissolved and anodic dissolution takes place. The process fluctuates over the surface and thereby causes a non-uniform dissolution, providing a more homogeneously textured surface than that obtained during conventional chemical etching. The high polarization activates the grains with a less favourable orientation from dissolution point of view; the current intensity increases and thereby the area is locally etched and passivated. The process goes on until a stationary state is reached.

The $SiO_2$ formed on the surface in the alkaline solution is only stable as long as the pH on the surface is locally low enough, pH<10. Due to local fluctuations of the current, the oxide has a tendency to be dissolved. After the initial state, as described, a stationary state is obtained; the dissolution rate and the formation rate of oxide are equal. The oxide formed on the surface becomes porous; its thickness is dependent on the potential applied, the alkali concentration, and the temperature.

The dissolution rate of Si and $SiO_2$ is dependent on the concentration of the $OH^-$-ions and the temperature; the dissolution rate increases with the $OH^-$ content and temperatures. In order to optimize the texture it is necessary to find a parameter combination which gives the desired topography. The parameters are: potential versus exposure time, alkali concentration, and temperature. However, it is probably not only one set of parameters which give an acceptable texturing. Therefore, the invention cover a wide set of parameter ranges in which a skilled person will be able to find by use of common knowledge and/or trial experiments.

In case of using NaOH or KOH as the alkali component, possible parameters employing the inventive method are: concentration of the alkali solution ranges from about 2 weight % alkali up to saturation, but will typically be in the range from about 10 weight % to about 40 weight % alkali. The bath temperature may be from about 10° C. up to about 70° C., but will typically be in the range from about 30° C. to about 50° C. As mentioned, the applied potential across the wafer and a platinum counter electrode may be in the range from +10 to +85 V, but will typically be in the range from about +20 to +85 V.

The exposure time or polarisation time, which is the immersion time of the wafer in the alkaline bath when the potential difference is being applied, is depended upon bath concentration, bath temperature and applied potential difference. The exposure timed decreases with increasing bath concentration, bath temperature and applied potential difference. Within the parameter ranges given above, the exposure times may be from about 1 minute up to about two hours, but will typically be in the range from about 5 to about 30 minutes. For the parameters given above, the term "about" is applied to imply that these boundaries are not absolute.

The wafers may advantageously be immersed in the alkaline etching fluid for a short pre-etching period before the potential is applied in order to obtain a damage free surface and/or removal of eventual surface oxide layer of the wafers. The pre-etching period may vary from 1-2 seconds to about 30 minutes, depending on the extent of damages and thickness of the surface oxide layer of the wafers, the alkali concentration and bath temperature. Typically pre-ething periods are about 5 to 10 minutes.

The imposed potential, and thus current, may be pulsed in order to enhance the electrochemical pit etching effect. In the case of NaOH or KOH as the alkali component, the potential may be pulsed pulsing from 85 to 20 V, the alkali solution may be from 2 to 40 weight % KOH or NaOH, and the temperature may be from 30 to 70 ° C. Examples of suitable parameter combinations includes, but are not limited to: Potential pulsing from 85 to 20 V, alkali solution from 10 to 40 weight % KOH or NaOH, and temperature from 30 to 50° C.; potential pulsing from 10-20 V at 10-40 weight % KOH or NaOH and temperature of 50-70° C.; potential pulsing from 85 to 20 V in 2-10 weight % KOH or NaOH, or from 40 weight % to saturation of KOH or NaOH at temperatures 30-50° C.; and potential pulsing from 85 to 20 V in 2-10 weight % KOH or NaOH or from 40 weight % to saturation of KOH or NaOH at temperatures 10-30° C. or from 50° C. to the boiling point of KOH- or NaOH-solution. In another embodiment, the concentration of the alkaline solution is from 10 to 40 weight %, the bath temperature is from 50° C. to the boiling point of KOH- or NaOH-solution, and the applied potential is pulsing in the range of 85 and 20 V.

The invention will thus obtain the same favourable texturing as the HF/HNO$_3$ process, but with use of the more environmental friendly and cost-effective alkaline etching solutions and without the problems with process control. Further, the porous surface, SiO$_2$, layer formed during electrochemical polarization increases the absorption of light due to the fact that its refraction index is smaller than the index of Si used for wafers. Thus, its anti-reflection properties are taken into account by the choice of polarization parameters. The structure and the thickness of the oxide are dependent of the parameters: OH$^-$-concentration, potential, temperature and exposure time.

LIST OF FIGURES

FIG. 1 is a Pourbaix-diagram of Si [1].

FIG. 2 is a SEM micrograph of as cut silicon wafer at magnification 3000×

FIG. 3 is a micrograph showing a wafer which is chemically etched; 20 weight % KOH, 50° C. and 10 minutes exposure time. Picture a) is at 1150× magnification and b) at 3200× magnification FIG. 4 is a micrograph showing a wafer which is pre-etched for 5 minutes in 30 weight % KOH at 50° C., then polarised for 10 minutes at 25 V. Picture a) is at 650× magnification and b) at 17000× magnification.

FIG. 5 is a micrograph showing a wafer which is polarised in 30 weight % KOH at 50° C. for 10 minutes at 25 V. (No pre-etching). Picture a) is at 1700× magnification and b) at 3200× magnification.

FIG. 6 is a micrograph showing a wafer which is pre-etched for 10 minutes in 20 weight % KOH at 40° C., then polarised for 5 minutes at 50 V. Picture a) is at 320× magnification and b) at 3200× magnification.

FIG. 7 is a micrograph showing a wafer which is pre-etched for 10 minutes in 10 weight % KOH at 50° C., then polarised for 10 minutes at 50 V. Picture a) is at 320× magnification and b) at 3200× magnification.

FIG. 8 is a micrograph showing a wafer which is pre-etched for 15 minutes in 5 weight % KOH at 50° C., then polarised for 10 minutes at 50 V. Picture a) is at 320× magnification and b) at 3200× magnification.

FIG. 9 is a micrograph showing a wafer which is polarised for 5 minutes in 5 weight % KOH at 70° C. with pulsing potential from 50 to 25 V. (No pre-etching). Picture a) is at 320× magnification and b) at 3200× magnification.

FIG. 10 is micrograph showing a wafer which is pre-etched for 5 minutes in 2 weight % KOH at 70° C., then polarised for 5 minutes at pulsing from 50 to 30 V. Picture a) is at 1700× magnification and b) at 3200× magnification (showing neighbour area of a)).

FIG. 11 is a micrograph showing a wafer which is pr-etched for 10 min minutes in 42 weight % KOH at 40° C., then polarised for 0.5 minutes at 85 V and then at 50 V for 5 min. The picture is at 3200× magnification.

FIG. 12 is a micrograph showing a wafer which is pre-etched for 5 min in 20 weight % KOH at 50° C. and then polarized at 6 V for 10 min. The picture is at 1000× magnification.

FIG. 13 is a micrograph showing a wafer pre-etched for 5 min in 20 weight % KOH at 85° C. and then polarized at 6V for 10 min. The picture is at 1000× magnification.

FIG. 14 is a XPS-spectrum recorded from a chemically etched wafer exposed to 20 weight % KOH at 50° C. for 10 min. This is the same sample as in FIG. 3.

FIG. 15 is a XPS-spectra recorded from a pre-etched and polarized sample; 30 weight % KOH, 25 V, 10 min. The notations (0 nm, 10 nm and 20 nm) represent the ion-etch depths.

FIG. 16 is a XPS-spectra recorded from a sample pre-etched for 10 min in 20 weight % KOH at 40° C., and then polarized: 5 min 20 V; 5 min 50 V, 0.5 min 70 V; 5 min 50 V; 0.5 min 70 V; 3 min 50 V; 4 min 20 V, 200×. The ion-etch depths are 0 nm, 20 nm, 40 nm and 60 nm. This is the same sample as in FIG. 17a-d.

FIG. 17a-d shows SEM-micrographs of a silicon wafer that has been pre-etched for 10 minutes in 20 weight % KOH at 40° C., then polarised for 5 minutes at 20 V, 5 minutes at 50 V, 0.5 minute at 70 V, 5 minutes at 50 V, 0.5 minutes at 70 V, 3 minutes at 50 V, and 4 minutes at 20 V. Picture a) is at 320× magnification, b) at 3200× magnification, c) at 17000× magnification, and d) at 35000× magnification.

FIG. 18 shows a comparison of measured reflectance of incoming light from silicon wafers. Upper curve shows wafer chemically etched in KOH, middle curve shows untreated (as-cut) wafer, and lower curve shows wafer etched according to the invention.

VERIFICATION OF THE INVENTION

The invention will be described in further detail by way of experiments verifying the effect of the invention. These experiments should not be considered as a limitation of the general inventive idea of employing a sufficiently high potential to obtain an anisotropic etching of silicon wafers in strong alkaline solutions.

In order to demonstrate the influence of electrochemical treatment on the topography of Si-wafers an experimental series has been performed. Samples were taken out of the sawing process, washed and dried according to conventional procedures for removing any kerfs and remains of the sawing fluid to form an untreated wafer, such as shown in FIG. 2, which is a SEM-micrograph at magnification of 3000×. The picture shows that the production of wafers by cutting silicon casts is caused by an abrasive wear mechanism forming brittle fracturing of the silicon. The surface of as-cut wafer is very shiny; around 30% of incident light is reflected.

The wafers were exposed to aqueous solutions containing KOH at concentrations varied in the range from 2 to 42 weight %. The temperature range was 30 to 70° C. The polarization time was between 2 to 15 min and the voltage was varied in the range 20 to 85 V. The potential was measured between the sample and a platinum counter electrode. After exposure the sample was withdrawn, soaked in de-ionized water, sprayed with ethanol and dried in a warm air stream. The potential was switched off immediately after withdrawn. However it was discovered that this is not critical. It was done in order to prevent dissolution of the oxide.

The treatments of the examples shown in the FIGS. 2 to 13 are summarized in Table 1. Experiments were also performed with parameter sets outside those shown in the table. These are comment below. It is expected that the technical application of electrochemical texturing will be within the body of the parameter sets used in the experiments described in the figures.

Some of the samples were pre-etched in the exposure solutions before the potentials were applied. These experiments were done in order to clarify the influence of chemical etching at the open potential before polarization. During the pre-etching the oxide formed during sawing of the wafer is dissolved. It is concluded below that the need of pre-etching is dependent on the exposure parameters.

TABLE 1

Treatment of wafers.

| FIG. no. | Pre-etching (min.) | Treatment | KOH (wt. %) | Temp. (° C.) | Time (min.) | Volt. (V) |
|---|---|---|---|---|---|---|
| 2 | — | Untreated wafer | — | — | — | — |
| 3 | — | Chemically etched | 20 | 50 | 10 | — |
| 4 | 5 | Polarized | 30 | 50 | 10 | 25 |
| 5 | 0 | Polarized | 30 | 50 | 10 | 25 |
| 6 | 10 | Polarized | 20 | 40 | 5 | 50 |
| 7 | 10 | Polarized | 10 | 50 | 10 | 50 |
| 8 | 15 | Polarized | 5 | 50 | 10 | 50 |
| 9 | 0 | Polarized | 5 | 70 | 5 | 50→25 |
| 10 | 5 | Polarized | 2 | 70 | 5 | 50→30 |
| 11 | 10 | Polarized | 42 | 40 | 5 | 85→50 |
| 12 | 5 | Polarized | 20 | 50 | 5 | 6 |
| 13 | 5 | Polarized | 20 | 85 | 5 | 6 |

FIG. 3, magnifications 1150× and 3200×, shows the surface of a chemically etched wafer. The exposure was 10 min in 20 weight % KOH at 50° C. Strong hydrogen evolution was observed after 2 min indicating that the pre-formed oxide is removed. The etch pattern is characteristic for etching of polycrystalline Si; the pyramid structure. FIG. 3a, is obtained during etching the (100) and (110) planes while the flat areas are from (111) planes. The temperature and the concentration used in this case might be lower than in practice; however the pre-etching in this case was enough to remove the surface defects formed during sawing.

The sample shown in FIG. 4 was pre-etched for 5 min in 30 weight % KOH at 50° C. and then polarized for 10 min at 25 V. At low magnification (650×) it appears that the surface is isotropically textured resulting in crater formation. The "diameter" of the craters is in the range 2 to 10 µm. At the higher magnification (17000×), FIG. 4b shows that micro pits are formed in the craters; the diameter of the pit openings is about 200 nm. Below the pitting mechanism will be discussed in the light of oxide formation.

The influence of pre-etching is demonstrated in FIG. 5. It shows a sample exposed to the same electrochemical parameters as that in FIG. 4, but it was not pre-etched. The potential was applied immediately after exposure to the solution. It occurs that the surface is not homogeneously etched; a relatively large part of the area is not etched at al. It is obvious that the pre-etching removes the surface oxide film and facilitates the pitting process.

The FIGS. 6 to 10 show electrochemical etchings performed in solutions containing lower concentrations of KOH; 20, 10, 5 and 2 weight %, respectively. In order to obtain as good etching result as possible it was necessary to vary the other parameters. The sample shown in FIG. 6 was polarized in 20 weight % KOH at 40° C. (lower values than in FIG. 4). In order to obtain the same isotropic texturing result, as shown in FIG. 4, it was necessary to increase the applied voltage from 25 V to 50 V. The exposure time on the other hand could be decreased to 5 minutes.

The FIGS. 7 and 8 demonstrate that etching in 10 and 5 weight % KOH gives acceptable surface structures. In these cases the pre-etchings were increased to 10 and 15 minutes, respectively. The temperature, voltage, and polarization time were 50° C., 50V and 10 minutes.

Experiments were also performed in 5 weight % KOH without pre-etching. A relatively good etching effect was achieved at 70° C. after 5 minutes, see FIG. 9. However, only a part of the surface was etched. At this temperature the cell current became high so that the voltage was decreased from 50 V to 25 V after about 30 s.

The micrographs in FIG. 10 are from a sample exposed to 2 weight % KOH at 70° C. It was pre-etched for 5 min, polarized for a few sec at 50 V and then for 5 min at 30° C. Even in this case the surface was only partly etched. However, the craters in the etched areas have the same morphology as those obtained in higher KOH concentrations at lower temperatures.

From the above it is obvious that pre-etching enhance the dissolution process. At high temperature, 70° C., it seems that the necessary pre-etching time is relatively short. No attempt has been done to optimize the pre-etching time.

FIG. 11 shows the topography after etching at high voltage, 85 V. The sample was pre-etched for 10 min in 42 weight % KOH at 40° C. and then polarised at 85 V for about 30 sec and then lowered to 50V for 5 min. Initially the current was very high and still even after lowering the voltage the current become high. It appears from the figure, magnification 3200×, that the surface is heavily etched. However, the optimum topography can probably be reached at lower KOH concentration and lower temperatures. The experiment was done in order to demonstrate that desired surface structure can be obtained even at high potentials.

Experiments were also performed at low voltage. The FIGS. 12 and 13 show surfaces after polarization for 10 min at 6 V in 20 weight % KOH at 50° C. and 85° C., respectively. The samples were pre-etched for 5 min and 2 min, respectively. It appears from the figures that the samples are not influenced at all of the electrochemical treatment. Both samples are only chemically etched.

The main idea behind this invention is that during polarization the surface pH becomes low enough to allow formation of $SiO_2$. The results demonstrate that the potential has to be relatively high so that enough oxygen is produced on the surface. The experiments performed at 6 V showed no effect, the potentials must be higher; at this low potential the wafer is not electrochemically etched neither at 50° C. nor at 85° C. in spite of the fact that the concentration of KOH is high, 20 weight %.

As stated, the pitting structure is obtained by simultaneous oxide formation and dissolution processes due to local variation of the surface pH governed by the oxygen reaction. It is therefore interesting to study formation of oxide after different treatments. The oxide thickness has been determined after exposure of some samples by utilizing XPS (XPS-X-ray Photoelectron Spectroscopy).

FIG. 14 shows a Si 2p signal recorded from a chemically etched sample represented by FIG. 3. The oxide thickness is calculated from the intensities of the peaks representing the oxide, $Si^{4+}$, and the zero valence state of silicon $Si^0$. The estimated oxide thickness is 1.5 nm.

FIG. 15 shows the Si 2p spectrum from the sample as shown in FIG. 4. The oxide is thicker than three times the electron mean free path; thereby the pure Si-state can not be detected. In order to determine the oxide thickness the surface was ion-etched in steps and analyzed. The thickness of the oxide can thereby be determined. The etch depths are marked in the figure. It appears that only the oxide state is recorded from the as-received state and after 10 nm ion-etching. After etching to 20 nm below the original surface the zero valence state of Si is detected. At this etch depth the intensity of the oxygen signal has dropped to half of its maximum value. This condition is used as measure of the oxide thickness. Thus, the average thickness of the oxide formed during electrochemical etching of this sample is in the range 10 to 20 nm. It has to be pointed out that the oxide can not be homogeneous in thickness; it has to be porous in order to allow dissolution of Si. This experiment gives support to the discovery that the isotropic texturing process is governed by an oxide formation and dissolution mechanism, which only takes place when higher potentials than +10 V are applied between the wafer and platinum counter electrode.

The aim of the experiment, which results are shown in the FIGS. 16 and 17, was to demonstrate the possibility to manipulate the surface morphology and the oxide thickness by variation of the cell voltage. The sample was pre-etched for 10 min in 20 weight % KOH at 40° C. (the same as FIG. 6). During exposure the voltage was varied vs. time as follows: 20 V for 5 min; 50 V for 5 min; 70 V for 0.5 min.; 50 V for 5 min; 70 V for 0.5 min; 50 V for 3 min; and 20 V for 4 min. The total exposure time was 23 min. FIG. 16 shows the recorded XPS-spectra. In this case the sample has to be etched down to 40 nm under the original surface before Si(0) state is recorded. At that level the oxygen signal had dropped to half its maximum value. Hence, the average oxide thickness is roughly 40 nm.

The SEM micrographs, FIG. 17a-d, show the surface of the sample polarized at various potentials. The same morphology is found everywhere on the surface. The FIGS. 17a and 17b show that the coarse craters are in the range 5 to 20 µm. Within and on the edge of the coarse craters smaller pits are revealed. The opening of these are 2 µm or smaller. At high magnifications, FIGS. 17c and 17d of 17000 and 35000× respectively, it appears that micro-pits are formed in these pits. The "diameter" of these micro-pits is in the range 100 to 200 nm.

The micro-pits as they are recorded by the secondary electrons might be an effect of the inhomogeneous distribution of oxide on the surface. It is suggested that edges of the pits are decorated by oxide ridges and that the oxygen reaction takes place at their roots. The dissolution takes place in the centre of the crater. The details of the mechanism have to be worked out later.

Reflectance Measurements

The recorded data, the reflectance versus the wave length of the light, is shown in FIG. 18. The middle curve shows the reflectance of the as-cut sample. Upper curve is achieved from a chemically NaOH (alkaline)-etched surface. This surface condition is that of the wafers produced at REC ScanCell today, employing a conventional chemical etching process. The lower curve (A7) is obtained after polarization as given in the example above. The figures show that it is possible to lower the reflectance considerably. In fact at 500 nm wavelength the reflectance of the polarized sample is reduced to ⅓ of that recorded from the alkaline etched surface.

Reference

1. Marcel Pourbaix, Atlas of Electrochemical Equilibria in Aqueous Solutions, NACE, Houston Tex., USA.

The invention claimed is:

1. A method for texturing a silicon solar cell wafer by isotropic etching, where the method comprises:
   isotropically etching the wafer by immersing the wafer in an alkaline solution at pH>10, and applying a potential difference between the wafer and a platinum electrode to form a textured silicon solar cell wafer,
   wherein:
   the alkaline solution is a KOH- or NaOH-solution with concentration from about 2 to about 40 weight % KOH or NaOH,
   a bath temperature is from about 30° C. up to about 50° C.,
   polarising times are from about 5 minutes to about 30 minutes, and
   the applied potential across the wafer and a platinum counter electrode is pulsing between +20 to +85 V.

2. The method according to claim 1, characterised in that the concentration is from about 10 weight % to about 40 weight % KOH or NaOH.

3. The method according to claim 1, characterised in that the concentration of the alkaline solution is from 2 to 10 weight %.

4. The method according to claim 3, characterised in that the wafer is subject to a pre-etching period before the potential is applied by being immersed in the alkaline solution without applying the potential.

5. The method according to claim 1, characterised in that the wafer is subject to a pre-etching period before the potential is applied by being immersed in the alkaline solution without applying the potential.

6. The method according to claim 5, characterised in that the pre-etching period varies from about 1 second to about 30 minutes.

7. The method according to claim 6, wherein the pre-etching period varies from about 5 to about 10 minutes.

8. The method according to claim 2, characterised in that the wafer is subject to a pre-etching period before the potential is applied by being immersed in the alkaline solution without applying the potential.

9. The method according to claim 1, wherein the silicon solar cell wafer is a multi-crystalline silicon.

10. The method according to claim 1, wherein the isotropic etching results in the formation of micro pits.

11. The method according to claim 10, wherein the micro pits have a diameter of about 100-200 nm.

* * * * *